US006541894B1

(12) United States Patent
Hänisch et al.

(10) Patent No.: US 6,541,894 B1
(45) Date of Patent: Apr. 1, 2003

(54) PIEZOELECTRIC ACOUSTIC ALARM

(75) Inventors: Thomas Hänisch, Berlin (DE); Peter Frank, London (GB)

(73) Assignee: MSA Auer GmbH, Berlin (DE)

( * ) Notice: Subject to any disclaimer, the term of this patent is extended or adjusted under 35 U.S.C. 154(b) by 0 days.

(21) Appl. No.: 10/031,734

(22) PCT Filed: Jul. 18, 2000

(86) PCT No.: PCT/DE00/02430

§ 371 (c)(1),
(2), (4) Date: Jun. 3, 2002

(87) PCT Pub. No.: WO01/08448

PCT Pub. Date: Feb. 1, 2001

(30) Foreign Application Priority Data

Jul. 23, 1999 (DE) ........................................ 199 35 768

(51) Int. Cl.[7] .......................... H04R 17/00; H01L 41/09
(52) U.S. Cl. ...................................................... 310/317
(58) Field of Search ......................................... 310/317

(56) References Cited

U.S. PATENT DOCUMENTS

| | | | | | |
|---|---|---|---|---|---|
| 2,875,355 | A | | 2/1959 | Petermann | 310/311 |
| 4,129,799 | A | | 12/1978 | Green | 310/359 |
| 4,237,399 | A | | 12/1980 | Sakamoto | 310/317 |
| 4,700,177 | A | * | 10/1987 | Nakashima et al. | 340/388.3 |
| 5,192,889 | A | * | 3/1993 | Myohga | 310/316.02 |
| 5,210,454 | A | * | 5/1993 | Naito | 310/316.02 |
| 5,258,743 | A | * | 11/1993 | Nelson et al. | 340/568.1 |
| 5,281,899 | A | | 1/1994 | Culp | 310/328 |
| 5,317,305 | A | * | 5/1994 | Campman | 340/573.1 |
| 5,842,288 | A | * | 12/1998 | Laseke et al. | 34/524 |
| 6,433,461 | B1 | * | 8/2002 | Shibatani | 310/317 |

FOREIGN PATENT DOCUMENTS

| | | | |
|---|---|---|---|
| DE | 3146948 | 6/1983 | H04R/17/00 |
| DE | 3423009 | 5/1986 | H04B/11/00 |
| EP | 0264991 | 4/1988 | G01F/1/66 |

OTHER PUBLICATIONS

"Generators Sonores A Ceramiques Piezoelectriques", Electronique Applications, Fr. Societe Parisienne D'Edition, Paris, No. 29, Apr. 1983, p. 97.

* cited by examiner

*Primary Examiner*—Thomas M. Dougherty
(74) *Attorney, Agent, or Firm*—Wood, Phillips, Katz, Clark & Mortimer

(57) ABSTRACT

In a piezoelectric acoustic alarm piezoelements (2*a*, 2*b*) each excited by a square-wave voltage are arranged opposite each other in a resonance cavity (1) and each oscillate in opposing directions. The two square-wave voltages ($V_a$, $V_b$) controlled by a microprocessor (8) are phase displaced by a square-wave pulse length and are positive or negative. A piezo-sound source designed and excited in this way is characterised by a high sound volume with low current consumption and small size.

5 Claims, 1 Drawing Sheet

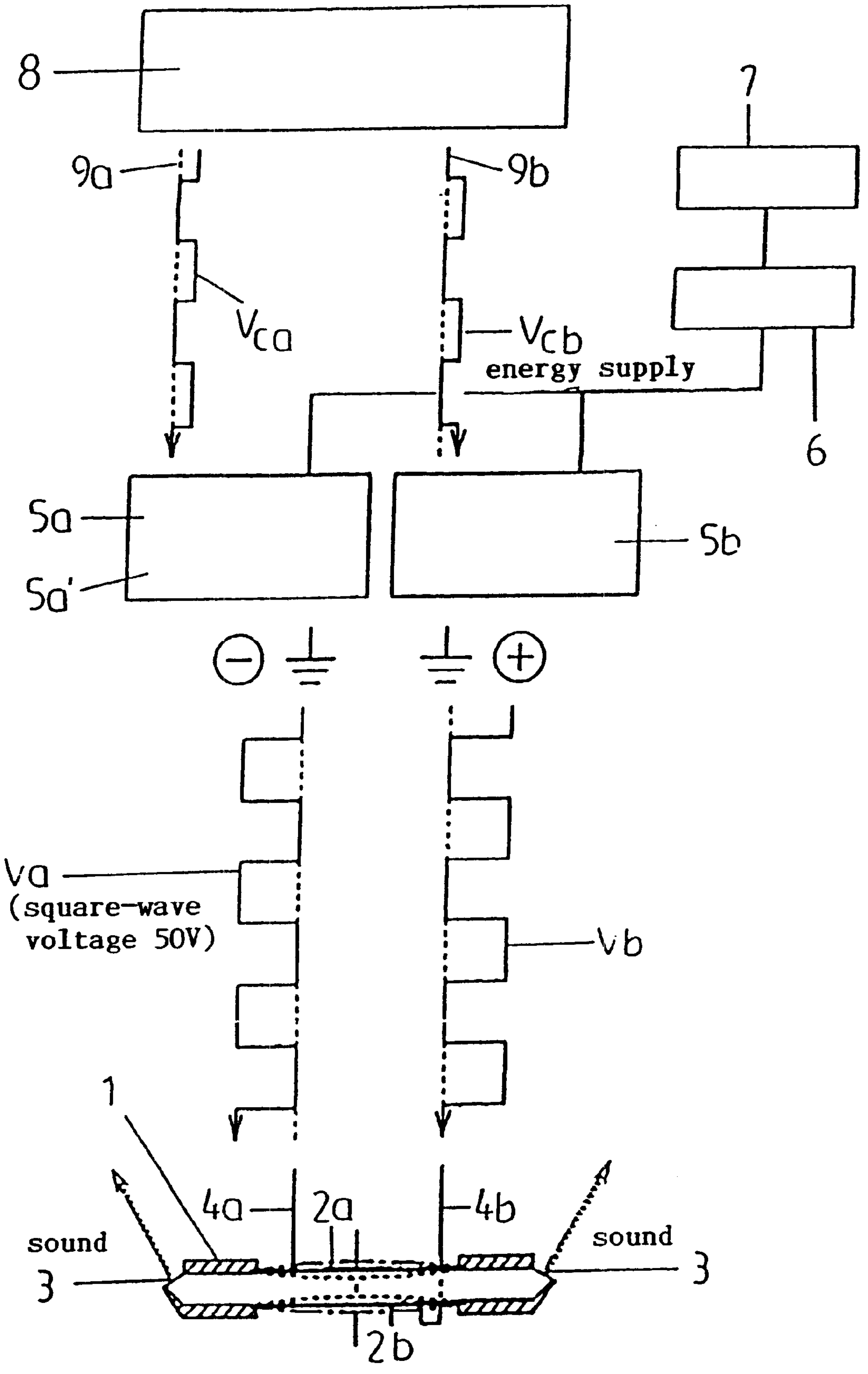
8
7
9a
9b
Vca
Vcb
energy supply
6
5a
5a'
5b
Va
(square-wave
voltage 50V)
Vb
1
4a
2a
4b
sound
sound
3
3
2b

PIEZOELECTRIC ACOUSTIC ALARM

The invention relates to a piezoelectric acoustic alarm comprising a resonance chamber with specific resonance frequency and a piezoelement coupled thereto connected via voltage amplifiers and an oscillation means producing a square-wave voltage to a direct current supply.

Sound generators of this type with which an acoustic warning signal is produced on the basis of the oscillations of a piezoelectric crystal or similar material with piezoelectric effects produced by electrical energy in reversal of the piezoelectric effect (electoscriction) have long been known in alarm systems. When an electric voltage is applied to a crystal of this type its shape is altered in order to return to its starting shape when the electric voltage is removed. The application of a pulsed voltage causes rapid oscillation of the crystal and consequently the emission of sound waves.

Acoustic alarms with a piezoelectric transducer naturally requiring a small amount of space are common in various fields of application, such as in error warning devices, fire alarms and smoke detectors, monitors for medical instruments and the like. However, as they do not generate a sufficiently loud sound volume they are limited in their possibilities of use. In many applications, for example in warning devices for persons working under dangerous conditions, such as divers, firemen, miners etc., it is necessary that under certain critical conditions the warning device triggering an acoustic alarm on the one hand does not exceed a specific dimension in terms of size and weight but on the other hand generates an acoustic signal which cannot be missed by the relevant person under the respective conditions.

Furthermore, the energy available and, more precisely in relation to the limited space available and in specific applications the explosion protection is limited.

The object of the invention is therefore to provide a piezoelectric acoustic alarm providing a high sound volume with a small space requirement and low current consumption.

The object is achieved according to the invention by a piezoelectric acoustic alarm designed in accordance with the features of claim 1.

The idea forming the basis of the invention consists in that two piezoelements are arranged opposite one another in a single resonance chamber and are excited by a square-shaped pulsating device voltage in such a way that they move or bend away or toward one another and therefore each oscillate in opposing directions. The opposing oscillation of the two piezoelements is achieved in such a way that a respective square-wave voltage pulsating between zero and a positive value is applied to the one piezoelement and a reversed square-wave voltage alternating between zero and a negative value respectively is applied to the other piezoelement and both square-wave voltages are phase displaced with respect to one another by a pulse length, starting from appropriate control siginals of a microprocessor. According the first piezoelement is bent in one direction upon a voltage pulse while the second piezoelement is bent in the opposing direction upon its reversed voltage pulse in the subsequent current-less phase of the first piezoelement now oscillating back.

Owing to the phase-displaced application of a respective reversed oscillating voltage, oscillations of two piezoelements which are directed toward one another are produced in one and the same resonance chamber, the common sound volume of which oscillations is greater than that from two individual piezoelectric sound generators. In addition, the space requirement and the component and control complexity are lower in the proposal according to the invention and owing to the phase-displaced supply of current the voltage peaks standing in the way of explosion protection regulations are avoided.

Further features and advantageous developments of the invention are found in the sub-claims and the description of a preferred embodiment of a sound generator given by way of example hereinafter.

An embodiment of the invention is described in more detail with the aid of the attached drawing in the single figure of which a resonance chamber is reproduced with the piezoelements attached thereto according to the invention and a simplified circuit arrangement for the phase-displaced and reversed supply of current according to the invention and for exciting the piezoelement.

The piezoelectric acoustic alarm comprises a resonance chamber 1, the inherent frequency of which is tuned to the frequency of the first and second piezoelements 2*a*, 2*b* connected thereto. A respective piezoelement 2*a* and 2*b* is attached to two opposing side walls of the resonance chamber 1 in such a way that they or their oscillation planes oppose one another exactly. The design of the piezoelements 2*a* and 2*b*, for example the arrangement of electrodes for the supply of energy, or the fastening and mounting thereof to the wall of the resonance chamber 1, is not shown in the drawing. Sound outlets 3 are provided on the opposing end faces of the resonance chamber 1.

To cause the piezoelements 2*a*, 2*b* to oscillate they are connected for the supply of energy via a respective first and second current line 4*a* and 4*b* and a first and second voltage amplifier 5*a* and 5*b* and a common fuse 6 to a direct current supply 7. A microprocessor 8 also supplied with energy from the direct current source 7 is connected via a respective first and second control signal line 9*a* and 9*b* to the relevant voltage amplifier 5*a* or 5*b*.

A first square-shaped pulsating control signal $V_{ca}$ (5 V-square-wave voltage) is guided from the microprocessor 8 via the first control line 9*a* to the first voltage amplifier 5*a* and a second square-shaped pulsating control signal $V_{cb}$ (5 V-square-wave voltage) phase-displaced by 180° to the first control signal $V_{ca}$ is guided via the second control line 9*b* to the second voltage amplifier 5*b*. While the control signal $V_{cb}$ is only amplified in the voltage amplifier 5*b* a voltage reverser 5*a* is additionally associated with the first voltage amplifier 5*a*.

The first piezoelement 2*a* is therefore supplied with an amplified (negative) square-wave voltage $V_a$ alternating between zero and a negative value. By contrast the second piezoelement 2*b* receives an amplified (positive) square-wave voltage pulsating between zero and a positive value, the voltage pulse of which is offset by a pulse width to that of the negative square-wave voltage $V_b$.

If in the event of an alarm, triggered by the microprocessor 8 the relevant square-wave voltage $V_a$ and $V_b$ is applied to the two piezoelements 2*a* and 2*b* they will bend upon each voltage pulse and oscillate owing to the successive voltage pulses.

Owing to the square-wave voltages $V_a$ and $V_b$ directed in opposite directions and the phase displacement thereof the first piezoelement 2*a* is pressed inwards (dotted line) upon the negative voltage pulse applied thereto, in order to oscillate back into the dot-dash position in the subsequent zero volt phase. However, at this instant the second piezoelement 2*b* is pressed outwards into the dot-dash position owing to the positive voltage pulse, in order to oscillate back inward into the dotted position in which, however, the first piezoelement 2*a* is simultaneously pressed inward again.

A particularly loud sound amounting to more than twice that of a piezoelectric sound generator with only one piezoelement is achieved owing to the directly opposing arrangement of the two piezoelements 2*a* and 2*b* and the oscillation thereof in opposite directions in one and the same resonance chamber 1. In addition, the spatial requirement and the circuitry complexity is low under these special preconditions. A further fundamental advantage is given by the phase-displaced voltage supplied to the two piezoelements and, more precisely, in that despite the simultaneous oscillation of two piezoelements only one piezoelement respectively, alternately with the other, has to be supplied with energy and therefore current peaks are avoided. The acoustic alarm therefore manages with a small fuse and additional complies with the explosion protection regulations.

| List of reference numerals | |
|---|---|
| 1 | resonance chamber |
| 2a | first piezoelement |
| 2b | second piezoelement |
| 3 | sound outlets |
| 4a | first current line |
| 4b | second current line |
| 5a | first voltage amplifier |
| 5a' | voltage reverser |
| 5b | second voltage amplifier |
| 6 | fuse |
| 7 | direct current supply (battery) |
| 8 | microprocessor |
| 9a | first control signal line |
| 9b | second control signal line |
| $V_{ca}$ | first square-shaped pulsating control signal (square-wave voltage) |
| $V_{cb}$ | second square-shaped pulsating control signal (square-wave voltage) |
| Va | amplified negative square-wave voltage |
| Vb | amplified positive square-wave voltage |

What is claimed is:

1. Piezoelectric acoustic alarm comprising a resonance cavity with specific resonance frequency and a piezoelement coupled thereto and connected via a voltage amplifier and an oscillation means producing a square-wave voltage to a direct current supply, characterised in that two piezoelements (2*a*, 2*b*) arranged opposite one another and each oscillating in opposing directions to one another are provided in the resonance cavity (1), means (8) for the phase displacement of the respective square-wave voltages applied to the piezoelements (2*a*, 2*b*) by a square-wave pulse width and means (5*a'*) for reversing a square-wave voltage being arranged opposite the other means.

2. Piezoelectric acoustic alarm according to claim 1, characterised in that the piezoelements (2*a*, 2*b*) are attached via appropriate carrier elements to or in the walls of the resonance cavity (1) opposing one another so as to be congruent with one another.

3. Piezoelectric acoustic alarm according to claim 1, characterised in that the resonance cavity (1) has lateral sound outlets (3) directed obliquely outwards.

4. Piezoelectric acoustic alarm according to claim 1, characterised by a microprocessor (8) for producing two square-wave voltages phase displaced to one another as control signals ($V_{ca}$, $V_{cb}$) for the voltage amplifiers (5*a*, 5*b*) connected on the one hand to the relevant piezoelement (2*a*, 2*b*) and on the other hand to the direct current supply (7) respectively.

5. Piezoelectric acoustic alarm according to claim 1, characterised in that a voltage reverser, (5*a'*) is associated with one of the voltage amplifiers (5*a*, or 5*b*).

* * * * *